(12) United States Patent
Son

(10) Patent No.: US 7,829,914 B2
(45) Date of Patent: Nov. 9, 2010

(54) NITRIDE SEMICONDUCTOR LIGHT-EMITTING DEVICE COMPRISING A BUFFER LAYER INCLUDING A PLURALITY OF LAYERS HAVING DIFFERENT LATTICE CONSTANTS AND METHOD FOR MANUFACTURING THE SAME

(75) Inventor: Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 1022 days.

(21) Appl. No.: 11/603,163

(22) Filed: Nov. 22, 2006

(65) Prior Publication Data

US 2007/0120142 A1  May 31, 2007

(30) Foreign Application Priority Data

Nov. 25, 2005  (KR) ............... 10-2005-0113329

(51) Int. Cl.
*H01L 33/00* (2010.01)
(52) U.S. Cl. .................... 257/103; 438/46

(58) Field of Classification Search ............ 257/13, 257/103, 190; 372/45.011; 438/46
See application file for complete search history.

(56) References Cited

U.S. PATENT DOCUMENTS

| 5,656,832 | A | * | 8/1997 | Ohba et al. | 257/190 |
| 5,679,965 | A | * | 10/1997 | Schetzina | 257/103 |
| 2001/0002048 | A1 | * | 5/2001 | Koike et al. | 257/80 |

* cited by examiner

*Primary Examiner*—Thomas L Dickey
(74) *Attorney, Agent, or Firm*—Birch, Stewart, Kolasch & Birch, LLP

(57) ABSTRACT

There are provided a nitride semiconductor light-emitting device and a method for manufacturing the same. The nitride semiconductor light-emitting device includes a buffer layer on a sapphire substrate, wherein the buffer layer includes a plurality of layers having different lattice constants, a first n-type nitride semiconductor layer on the buffer layer, an active layer on the first n-type nitride semiconductor layer, and a p-type nitride semiconductor layer on the active layer.

14 Claims, 6 Drawing Sheets

NITRIDE SEMICONDUCTOR LIGHT-EMITTING DEVICE COMPRISING A BUFFER LAYER INCLUDING A PLURALITY OF LAYERS HAVING DIFFERENT LATTICE CONSTANTS AND METHOD FOR MANUFACTURING THE SAME

BACKGROUND OF THE INVENTION

1. Field of the Invention

The present invention relates to a nitride semiconductor light-emitting device and a method for manufacturing the same.

2. Description of the Related Art

A related art nitride semiconductor light-emitting device includes a nitride semiconductor material having the empirical formula represented as $Al_xIn_yGa_{(1-x-y)}N$ ($0 \leq x \leq 1$, $0 \leq y \leq 1$, $0 \leq x+y \leq 1$). In particular, researches for a semiconductor light-emitting device using gallium nitride (GaN) are being actively advanced currently. For example, a sapphire substrate, which is an insulating substrate, is generally used up to now because there does not yet exist a commercial substrate having the crystal structure identical to and lattice-matched with the nitride semiconductor material such as GaN in the nitride semiconductor light-emitting device.

Between the sapphire substrate and the GaN layer grown thereon, a lattice mismatch occurs due to differences between respective lattice constants and between respective thermal expansion coefficients. Thus, to prevent this lattice mismatch, a GaN buffer layer, which is grown at a low temperature, is formed on the sapphire substrate, and thereafter a GaN layer is grown on the buffer layer at a high temperature. The reason is to reduce the lattice constant difference between the sapphire substrate and the GaN layer.

However, the GaN buffer layer grown at the low temperature has many crystalline defects, and it has amorphous property rather than crystalline property. Therefore, if the GaN layer is directly grown on the low temperature growth buffer layer at the high temperature, many crystalline defects such as dislocations propagate into the high temperature growth GaN layer. In the related art, to grow a dislocation-free GaN layer, there is employed a lateral epitaxial overgrowth (LEO) method or a pendeo-epitaxy method.

FIGS. 1A to 1D are schematic sectional views illustrating a method of growing a GaN layer using the LEO method according to the related art.

Referring to FIG. 1A, a GaN epitaxial layer 11 is grown on a sapphire substrate 10 first. Hereinafter, the GaN epitaxial layer 11 grown on the sapphire substrate is referred to as a primary GaN epitaxial growth layer 11. Thereafter, referring to FIG. 1B, a mask 12 having a predetermined pattern is formed on the primary GaN epitaxial growth layer 11, wherein the mask 12 is formed of silicon oxide, silicon nitride and so on.

Afterwards, referring to FIG. 1C, a GaN layer 13 is regrown on a portion where the mask 12 is not formed. More specifically, the GaN layer 13 is grown laterally as indicated as an arrow of FIG. 1C. When the lateral growth of the GaN layer 13 is completed, the growth of the GaN layer 13 is completed as illustrated in FIG. 1D.

Meanwhile, a pendeo-epitaxy method is similar to the LEO method. That is, the pendeo-epitaxy method includes: epitaxially growing a primary GaN epitaxial layer on a sapphire substrate; forming a mask on the primary GaN epitaxial layer; removing the primary GaN epitaxial layer over which the mask is not formed using an etching process; and regrowing a GaN epitaxial layer over a groove after growing the groove.

In general, it is known that the number of dislocations propagating in the GaN layer formed by the LEO method or the pendeo-epitaxy method is reduced.

Referring to FIG. 2, the dislocation A existing under an exposed portion of the primary GaN epitaxial growth layer 11 propagates into the regrown GaN layer 13. However, the dislocation existing under a portion of the primary GaN epitaxial growth layer 11 covered with the mask 12 does not propagate into the regrown GaN layer 13 because the GaN layer 13 over the mask 12 is grown laterally. Thus, the defect can be somewhat decreased in virtue of the lateral growth.

However, when growing the GaN layer according to the related art, besides the dislocation A in the primary GaN epitaxial layer uncovered with the mask 12 propagates upward, there exists a problem that high density dislocation B occurs at a contact surface where the GaN layers 13 laterally grown from both sides of the mask 12 meet together.

In addition, there is another problem that defects occur due to the stress formed between the mask 12 and the regrown GaN layer 13. These defects such as dislocations or the like cause the electrical and optical properties of the nitride semiconductor device to be degraded, which lead to a yield drop after all.

Furthermore, the manufacturing cost increases inevitably because the related art LEO or pendeo-epitaxy method requires a process of preparing a mask. Moreover, the manufacturing process is too complicated because the patterning process and regrowing process should be additionally performed after growing the primary epitaxial layer.

Even though the LEO method or the pendeo-epitaxy method is used for reducing the defects caused by lattice mismatch, it is difficult to remarkably reduce the defects such as dislocations according to the related art. Instead, the process becomes complicated and the manufacturing cost is increased due to the additional processes.

Therefore, there are required a new nitride semiconductor light-emitting device with enhanced electrical and optical properties and a manufacturing method thereof in this technical field, which can prevent the defects such as dislocations caused by the lattice mismatch between the sapphire substrate and the nitride semiconductor material, e.g., GaN.

SUMMARY OF THE INVENTION

Accordingly, the present invention is directed to a nitride semiconductor light-emitting device and a method for manufacturing the same that substantially obviates one or more problems due to limitations and disadvantages of the related art.

The present invention provides a nitride semiconductor light-emitting device with excellent electrical and optical properties by preventing defects such as dislocation propagation caused by lattice mismatch.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In an embodiment of the invention, there is provided a nitride semiconductor light-emitting device including: a buffer layer on a sapphire substrate, wherein the buffer layer includes a plurality of layers having different lattice constants; a first n-type nitride semiconductor layer on the buffer layer; an active layer on the first n-type nitride semiconductor layer; and a p-type nitride semiconductor layer on the active layer.

In another embodiment of the present invention, there is provided a method for manufacturing a nitride semiconductor light-emitting device including: forming a buffer layer on a sapphire substrate, wherein the buffer layer includes a plurality of layers having different lattice constants; forming a first n-type nitride semiconductor layer on the buffer layer; forming an active layer on the first n-type nitride semiconductor layer; and forming a p-type nitride semiconductor layer on the active layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

It will also be understood that when a layer is referred to as being "on" another layer or substrate, it can be directly on the other layer or substrate, or intervening layers may also be present.

Although it will be illustrated that the nitride semiconductor light-emitting device according to the present invention adopts a sapphire substrate and it is applied to a light-emitting device having multi quantum well (MQW), it is not limited to them.

In accordance with the nitride semiconductor light-emitting device and a manufacturing method thereof according to the embodiment of the present invention, it is possible to prevent the occurrence of lattice mismatch by breaking inherent lattice constants of materials through a continuous growth of materials with different lattice constants, e.g., particularly, materials with severely different lattice constants.

That is, according to the embodiment of the present invention, a sapphire substrate is covered with a silicon material having a larger lattice constant than that of the sapphire substrate, wherein the silicon formed on the sapphire substrate acts as a primary buffer layer. Thereafter, an indium nitride (InN) layer having a smaller lattice constant than the silicon is grown on the silicon surface, and an aluminum nitride (AlN) layer is then grown on the InN layer. The present invention makes the lattice constant similar to that of the GaN using a supper lattice configured with Si/InN/AlN. To make a reference lattice constant, the GaN layer may be grown intermediately.

Because several layers having different lattice constants are coupled, a tensile stress is exerted on one portion but a compressive stress is exerted on another portion. Thus, a summation of total stress releases a tensile stress exerted on the gallium nitride from the sapphire so that it is possible to prevent the defect such as dislocation propagation caused by lattice mismatch.

FIGS. 3A to 3E are schematic sectional views illustrating a method of manufacturing a nitride semiconductor light-emitting device according to an embodiment of the present invention.

Figure 1A:
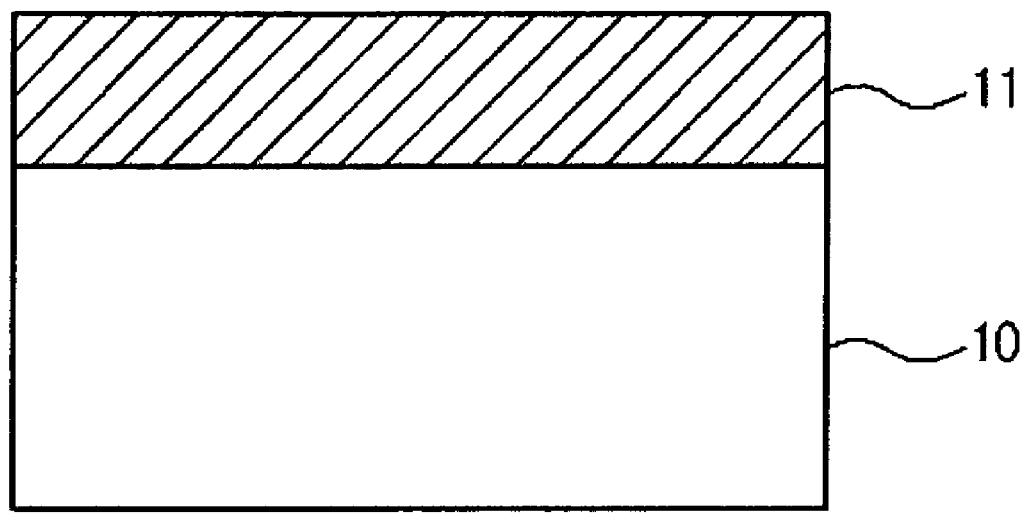
FIGS. 1A to 1D are schematic sectional views illustrating a method for forming a nitride semiconductor light-emitting device according to the related art.
Figure 1B:
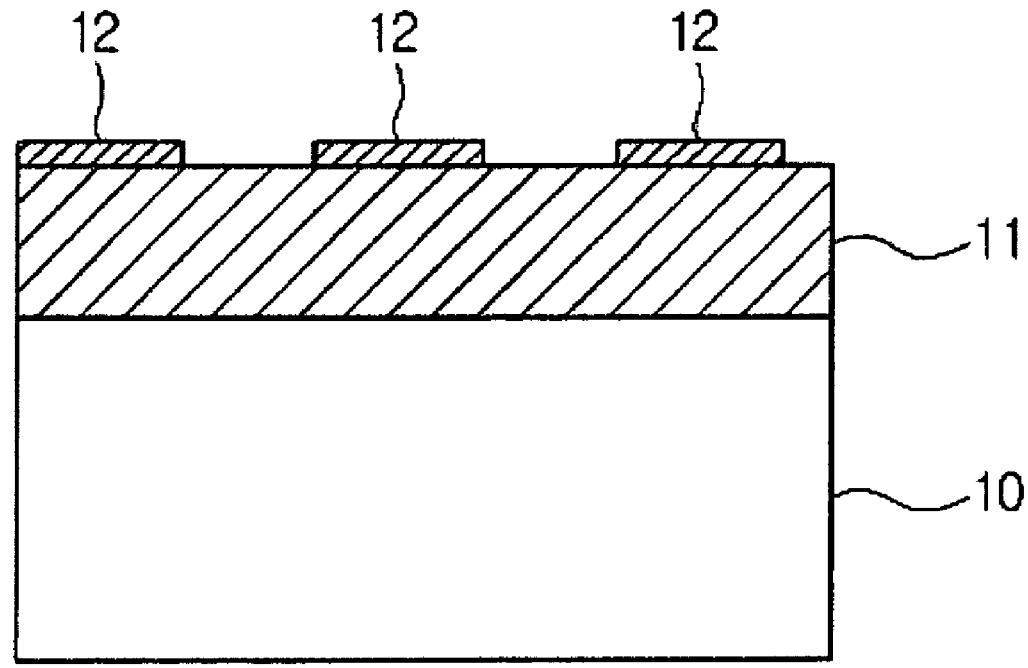
Figure 1C:
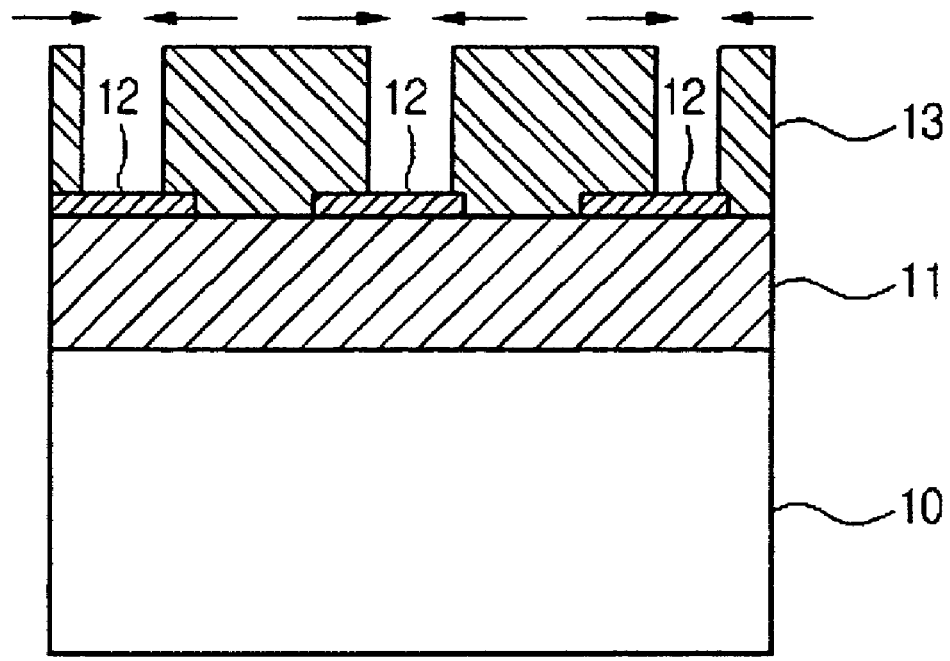
Figure 1D:
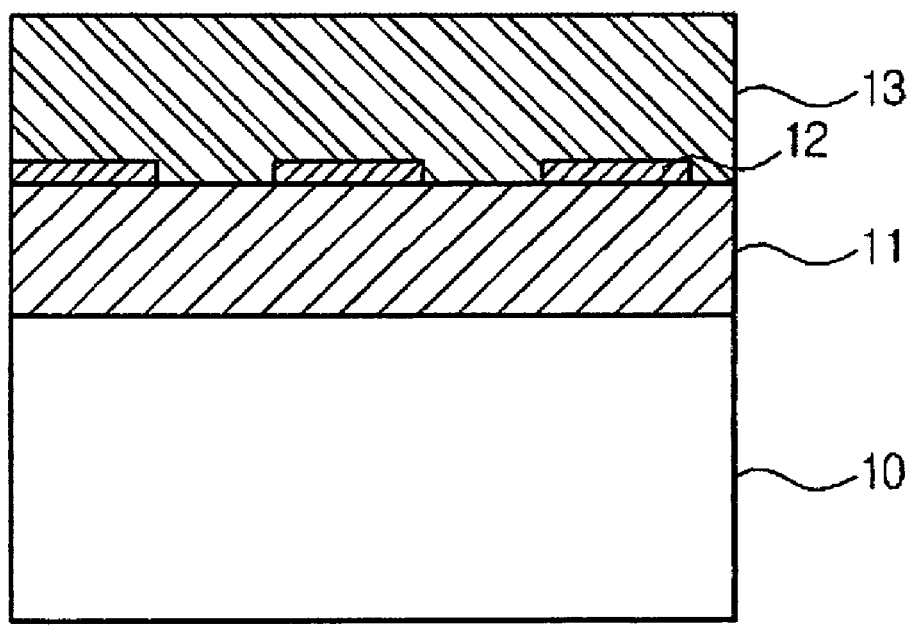
Figure 2:
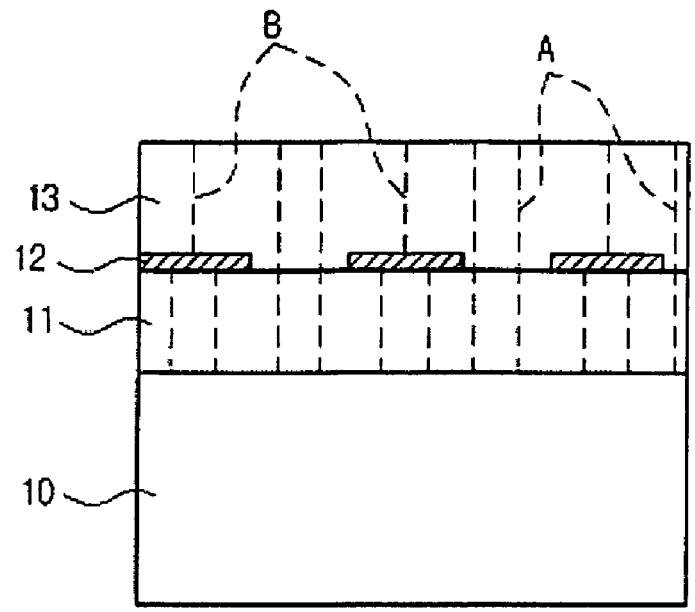
FIG. 2 is a schematic sectional view illustrating dislocations generated in the nitride semiconductor light-emitting device according to the related art.
Figure 3A:
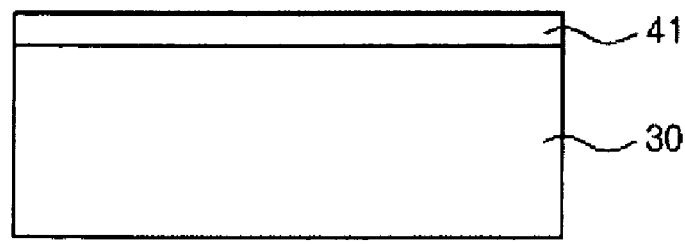
FIGS. 3A to 3E are schematic sectional views illustrating a method for manufacturing a nitride semiconductor light-emitting device according to an embodiment of the present invention.

To begin with, FIG. 3A is a sectional view illustrating a state that a silicon layer 41 is formed on a sapphire substrate 30 during a process for manufacturing a nitride semiconductor light-emitting device according to the present invention.

Referring to FIG. 3A, to form the silicon layer 41 on the sapphire substrate 30, the sapphire substrate 30 is mounted within a metal organic chemical vapor deposition (MOCVD) chamber (not shown) or a molecular beam epitaxy (MBE) chamber (not shown). Thereafter, silicon is grown on the sapphire substrate 30 at an ambient temperature ranging from 500° C. to 600° C. using silane gas ($SiH_4$) to thereby form a silicon layer 41 with a thickness of approximately 10 µm.

Figure 3B:
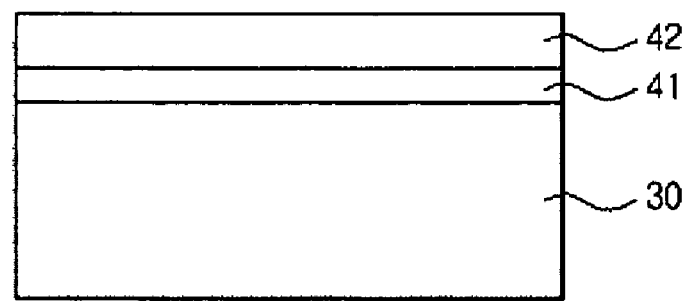

Thereafter, referring to FIG. 3B, an InN layer 42 is formed on the silicon layer 41. To form the InN layer 42 on the silicon layer 41, for example, the InN layer 42 containing indium (In) and nitrogen (N) at a predetermined ratio is grown on the silicon layer 41 using trimethylindium (TMI) and ammonia ($NH_3$) in a temperature range of 300° C. to 500° C.

Figure 3C:
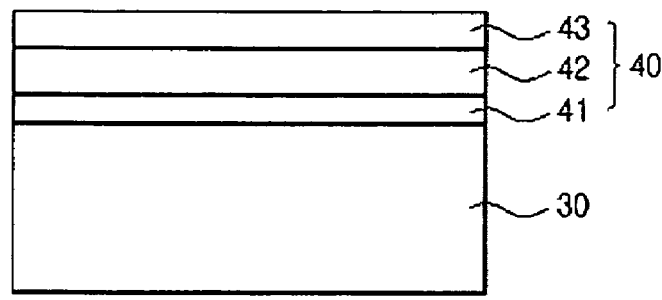

Subsequently, referring to FIG. 3C, an AlN layer 43 is formed on the InN layer 42 to provide a buffer layer 40 over the sapphire substrate 30. To form the AlN layer 43 on the InN layer 42, for example, the AlN layer 43 containing aluminum (Al) and nitrogen (N) at a predetermined ratio is grown on the InN layer 42 using trimethylaluminum (TMA) and ammonia ($NH_3$) in a temperature range of 900° C. to 1,100° C. Thus, there is formed the buffer layer configured with the silicon layer 41, the InN layer 42, and the AlN layer 43.

In addition, the buffer layer 40 may have a supper lattice structure with a multi-stacked structure configured with at least one silicon layer 41, at least one InN layer 42, and at least one AlN layer 43.

Figure 3D:
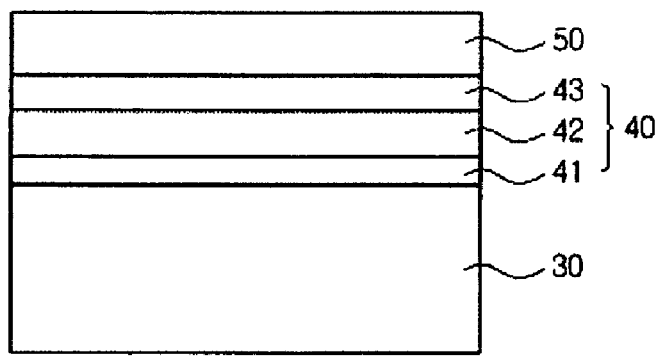

Afterward, referring to FIG. 3D, an undoped GaN layer 50 is formed on the AlN layer 43 of the buffer layer 40. To form the undoped GaN layer 50 on the AlN layer 43 of the buffer layer 40, for example, the undoped GaN layer 50 is grown to a predetermined thickness on the buffer layer 40 at a growth temperature ranging from 600° C. to 800° C. by supplying $NH_3$ and trimethylgallium (TMG) onto the buffer layer 40.

Figure 3E:
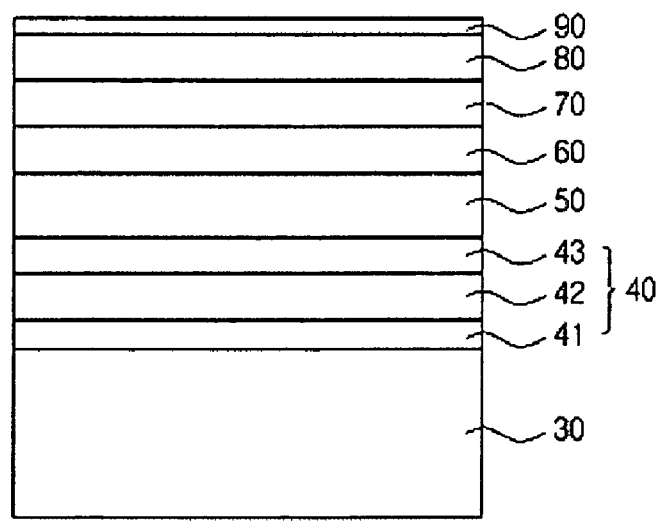

Next, referring to FIG. 3E, a first n-type GaN layer 60 is formed on the undoped GaN layer 50.

To form the first N-type GaN layer 60 on the undoped GaN layer 50, for example, the first N-type GaN layer 60 is grown to a predetermined thickness on the undoped GaN layer 50 by supplying NH$_3$, TMG, and silane gas containing silicon (Si) and n-type dopant such as indium (In) onto the buffer layer 40.

Thereafter, an active layer 70 is grown on the first n-type GaN layer 60. Herein, to grow the active layer 70, for example, the active layer 70 formed of InGaN is grown to a thickness in range of 30 μm to 100 μm at a growth temperature of 780° C. by using nitrogen gas as carrier gas and supplying NH$_3$, TMG, and TMI. Here, the active layer may have a multi-stacked structure, whose composition has different molar ratio of respective element components of InGaN.

Afterward, a p-type GaN layer 80 containing p-type dopant is grown to a thickness in range of several hundreds to several thousands angstroms on the active layer 70.

Subsequently, a thermal treatment is performed in a temperature range of 500° C. to 900° C. so as to control a hole concentration of the p-type GaN layer 80 to be maximized. Then, a second n-type GaN layer 90 is formed on the p-type GaN layer 80 by supplying silane gas containing n-type dopant, thereby forming an NPN configuration.

After forming the second n-type GaN layer 90, a wet etching process, e.g., anisotropic etching process, is performed for realizing an n-type electrode (not shown) to expose the first n-type GaN layer 60.

After exposing the first N-type GaN layer 60 using the anisotropic etching process, the n-type electrode is formed of titanium (Ti) on the first n-type GaN layer 60, and a p-electrode (not shown) is formed on the second n-type GaN layer 90. Here, the p-electrode may be a transparent electrode formed of one selected from the group consisting of ITO, ZnO, RuOx, TiOx, and IrOx.

The nitride semiconductor light-emitting device includes a buffer layer on a sapphire substrate, wherein the buffer layer includes a plurality of layers having different lattice constants, a first n-type nitride semiconductor layer on the buffer layer, an active layer on the first n-type nitride semiconductor layer and a p-type nitride semiconductor layer on the active layer. The buffer layer includes a first buffer layer on the sapphire substrate, the first buffer layer having a larger lattice constant than the sapphire substrate, a second buffer layer on the first buffer layer, the second buffer layer having a smaller lattice constant than the first buffer layer, a third buffer layer on the second buffer layer, the third buffer layer having a smaller lattice constant than the second buffer layer, the sapphire substrate (or Al$_2$O$_3$) and the n-type nitride semiconductor layer.

Figure 4:
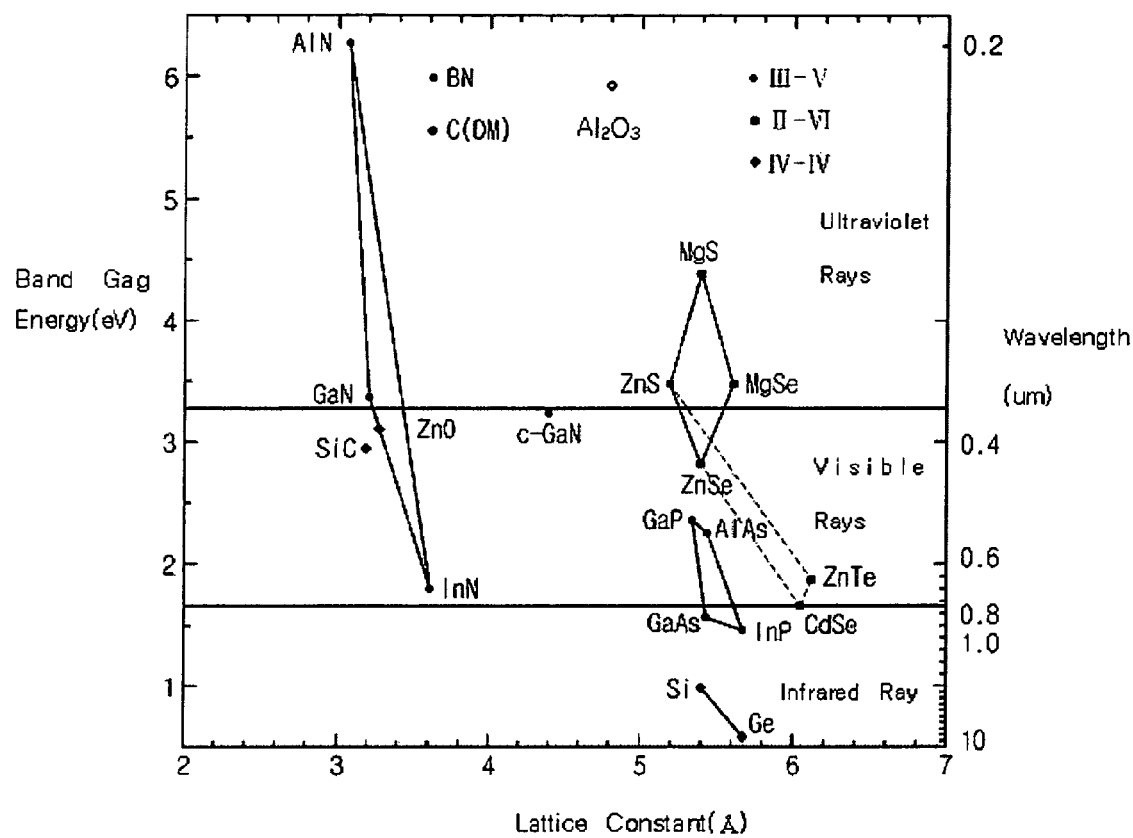
FIG. 4 is a graph illustrating the nitride semiconductor light-emitting device according to the embodiment of the present invention.

In the inventive nitride semiconductor light-emitting device formed as above, the buffer layer 40 includes the silicon layer 41, the InN layer 42 and the AlN layer 43. As illustrated in FIG. 4, the sapphire of the sapphire substrate 30, the silicon of the silicon layer 41, the InN layer 42 and the AlN layer 43 have the lattice constants of, 4.758 Å, 5.4 Å, 3.548 Å and 3.112 Å, respectively. As a result, since the undoped GaN layer 50 having the lattice constant of 3.189 Å is in contact with the AlN layer 43 having the lattice constant of 3.112 Å, the lattice mismatch with respect to the undoped GaN layer 50 can be improved. Accordingly, it is possible to prevent the dislocation from propagating from the sapphire substrate 30 to the undoped GaN layer 50, which is mainly caused by the lattice mismatch.

Figure 5:
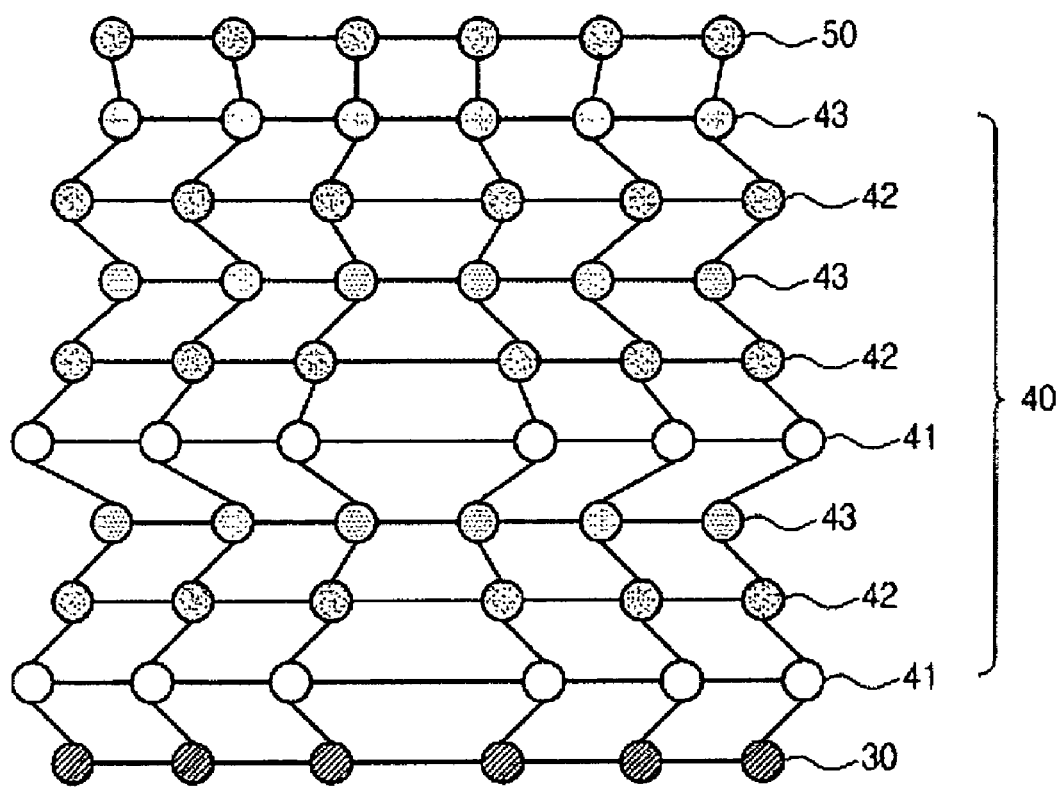
FIG. 5 is a schematic view illustrating a lattice array of a nitride semiconductor light-emitting device according to another embodiment of the present invention.

FIG. 5 is a schematic view illustrating a lattice array of a nitride semiconductor light-emitting device according to another embodiment of the present invention.

Referring to FIG. 5, the nitride semiconductor light-emitting device according to another embodiment of the present invention includes a multi-stacked structure of Si/InN/AlN lattice-coupled to an overlying undoped GaN layer 50, wherein the multi-stacked structure is configured with a plurality of silicon layers 41, a plurality of InN layers 42 and a plurality of AlN layers 43. In the nitride semiconductor light-emitting device according to another embodiment of the present invention, a tensile stress is exerted on one portion but a compressive stress is exerted on another portion. Thus, a summation of total stress releases a stress exerted on the undoped GaN layer 50 from the sapphire.

As described above, according to the nitride semiconductor light-emitting device and the manufacturing method thereof in accordance with the embodiment of the present invention, it is possible to form the nitride semiconductor light-emitting device with excellent quality by minimizing the dislocation propagation caused by the lattice mismatch in the nitride semiconductor layer. Therefore, endurance of the nitride semiconductor light-emitting device can be enhanced and the leakage current can be decreased.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A nitride semiconductor light-emitting device comprising:
   a buffer layer on a sapphire substrate, wherein the buffer layer includes a plurality of layers having different lattice constants;
   a first n-type nitride semiconductor layer on the buffer layer;
   an active layer on the first n-type nitride semiconductor layer; and
   a p-type nitride semiconductor layer on the active layer,
   wherein the buffer layer comprises:
   a first buffer layer on the sapphire substrate, wherein the first buffer layer has a larger lattice constant than the sapphire substrate;
   a second buffer layer on the first buffer layer, wherein the second buffer layer has a smaller lattice constant than the first buffer layer; and
   a third buffer layer on the second buffer layer, wherein the third buffer layer has a smaller lattice constant than the second buffer layer,
   the third buffer layer having a smaller lattice constant than the sapphire substrate,
   wherein the buffer layer includes a multi-stacked structure configured with at least one silicon layer, at least one InN layer, and at least one AlN layer.

2. The nitride semiconductor light-emitting device according to claim 1, wherein:
   the silicon layer is on the sapphire substrate as the first buffer layer;
   the InN layer is on the silicon layer as the second buffer layer; and
   the AlN layer is on the indium nitride layer as the third buffer layer.

3. The nitride semiconductor light-emitting device according to claim 1, comprising an undoped nitride semiconductor layer between the buffer layer and the first n-type nitride semiconductor layer.

4. The nitride semiconductor light-emitting device according to claim 1, wherein the active layer comprises the shape of a multi-stacked structure, whose composition has different molar ratio of respective element components of InGaN.

5. The nitride semiconductor light-emitting device according to claim 1, comprising a second n-type nitride semiconductor layer on the p-type nitride semiconductor layer.

6. A nitride semiconductor light-emitting device comprising:
   a buffer layer on a sapphire substrate, wherein the buffer layer includes a plurality of layers having different lattice constants;
   a first n-type nitride semiconductor layer on the buffer layer;
   an active layer on the first n-type nitride semiconductor layer; and
   a p-type nitride semiconductor layer on the active layer,
   wherein the buffer layer comprises:
   a first buffer layer on the sapphire substrate, wherein the first buffer layer has a larger lattice constant than the sapphire substrate;
   a second buffer layer on the first buffer layer, wherein the second buffer layer has a smaller lattice constant than the sapphire substrate; and
   a third buffer layer on the second buffer layer, wherein the third buffer layer has a smaller lattice constant than the first n-type nitride semiconductor layer,
   the third buffer layer having a smaller lattice constant than the sapphire substrate,
   wherein the buffer layer includes a multi-stacked structure configured with at least one silicon layer, at least one InN layer, and at least one AlN layer.

7. A method for manufacturing a nitride semiconductor light-emitting device comprising:
   forming a buffer layer on a sapphire substrate, wherein the buffer layer includes a plurality of layers having different lattice constants;
   forming a first n-type nitride semiconductor layer on the buffer layer;
   forming an active layer on the first n-type nitride semiconductor layer; and
   forming a p-type nitride semiconductor layer on the active layer,
   wherein the forming of the buffer layer comprises:
   forming a first buffer layer on the sapphire substrate, wherein the first buffer layer has a larger lattice constant than the sapphire substrate;
   forming a second buffer layer on the first buffer layer, wherein the second buffer layer has a smaller lattice constant than the first buffer layer; and
   forming a third buffer layer on the second buffer layer, wherein the third buffer layer has a smaller lattice constant than the second buffer layer,
   the third buffer layer having a smaller lattice constant than the sapphire substrate,
   wherein the forming of the buffer layer comprises:
   forming a silicon layer on the sapphire substrate as the first buffer layer;
   forming an InN layer on the silicon layer as the second buffer layer; and
   forming an AlN layer on the indium nitride layer as the third buffer layer.

8. The method according to claim 7,
   wherein the forming of the silicon layer, the forming of the indium nitride layer, and the forming of the aluminum nitride layer are performed at least twice.

9. The method according to claim 8, wherein the forming of the indium nitride layer is performed in a temperature range of 300 ° C. to 500 ° C. using trimethylindium and $NH_3$.

10. The method according to claim 8, wherein the forming of the AlN layer is performed at an ambient temperature in range of 900 ° C. to 1,100 ° C. using trimethylaluminum and $NH_3$.

11. The method according to claim 7, comprising forming an undoped nitride semiconductor layer on the buffer layer.

12. The method according to claim 11, wherein the forming of the undoped nitride semiconductor layer is performed at a growth temperature in range of 600 ° C. to 800 ° C. by supplying $NH_3$ and trimethylgallium.

13. The method according to claim 7, comprising forming a second n-type nitride semiconductor layer on the p-type nitride semiconductor layer.

14. The method according to claim 7, wherein the active layer is formed in the shape of a multi-stacked structure, whose composition has different molar ratio of respective element components of InGaN.

* * * * *